United States Patent [19]

Lee

[11] Patent Number: 5,638,333

[45] Date of Patent: Jun. 10, 1997

[54] BIT LINE SENSING CIRCUIT AND METHOD OF A SEMICONDUCTOR MEMORY DEVICE

[75] Inventor: Sang-Bo Lee, Yongin-gun, Rep. of Korea

[73] Assignee: Samsung Electronics Co., Ltd., Suwon, Rep. of Korea

[21] Appl. No.: 487,324

[22] Filed: Jun. 7, 1995

[30] Foreign Application Priority Data

Jun. 10, 1994 [KR] Rep. of Korea ................ 13140/1994

[51] Int. Cl.$^6$ .................................................. G11C 7/00
[52] U.S. Cl. ...................... 365/205; 365/174; 365/207; 365/208; 327/51; 327/57
[58] Field of Search ............................. 365/205, 207, 365/208, 194; 327/51, 57

[56] References Cited

U.S. PATENT DOCUMENTS

| | | | |
|---|---|---|---|
| 5,130,580 | 7/1992 | Min | 327/57 |
| 5,140,199 | 8/1992 | Seo | 327/57 |
| 5,315,550 | 5/1994 | Tobita | 365/194 |
| 5,319,253 | 6/1994 | You | 365/194 |
| 5,412,605 | 5/1995 | Ooishi | 365/205 |

*Primary Examiner*—Son T. Dinh
*Attorney, Agent, or Firm*—Cushman Darby & Cushman, IP Group of Pillsbury Madison & Sutro LLP

[57] ABSTRACT

A bit line sensing circuit of a semiconductor memory device having NMOS and PMOS sense amps connected to a bit line includes a variable delay path for variably controlling an interval of the operating time between the NMOS and PMOS sense amps in response to a power voltage sensing signal generated by sensing a power voltage level.

18 Claims, 5 Drawing Sheets

BIT LINE SENSING CIRCUIT AND METHOD OF A SEMICONDUCTOR MEMORY DEVICE

BACKGROUND OF THE INVENTION

1. Field of the Invention

The present invention relates to semiconductor memory devices, and more particularly to a bit line sensing circuit and method of a semiconductor memory device.

2. Description of Related Art

As semiconductor memory devices tend toward high integration and large capacity, higher speed operations are demanded. Typically, a dynamic random access memory (DRAM) consists of one access transistor and one storage capacitor, and data is stored in the storage capacitor. The data stored in the storage capacitor is transferred to a bit line through the channel of the access transistor, and the transferred data is amplified through a sense amplifier (sense amp) connected to the bit line and generated to the exterior.

In a semiconductor memory device which is capable of successively accessing data, after a data access operation, an operation for equalizing and precharging the bit line is implemented prior to the next access operation. Since the data access operation is executed to or from a memory cell, a pair of bit lines BL and $\overline{BL}$ are developed to a predetermined level for the next access operation. Therefore, as is well known, the bit lines BL and $\overline{BL}$ should be precharged to a prescribed level after being equalized. Similarly, a pair of PMOS and NMOS sense amps, which are connected between the bit line and a data input/output line and sense and amplify data, should be equalized and precharged to the same level.

For the high speed operation of the semiconductor memory device, it is very important to reduce the time required for data transferred to the bit line to be amplified through the sense amp. However, high integration is accompanied by low operating power voltage, which delay the operation speed of each circuit within the semiconductor memory device. Hence, it is difficult to reduce the bit line sensing time.

FIG. 1 illustrates a conventional bit line sensing circuit. A PMOS sense amp 40 and an NMOS sense amp 35 are respectively connected between bit lines BL and $\overline{BL}$. The PMOS sense amp 40 includes a first PMOS transistor T3 having a source electrode connected to a sensing node LA, a drain electrode connected to the bit line BL and a gate electrode connected to the bit line $\overline{BL}$, and a second PMOS transistor T4 having a source electrode connected to the sensing node LA, a drain electrode connected to the bit line $\overline{BL}$ and a gate electrode connected to the bit line BL. The NMOS sense amp 35 includes a first NMOS transistor T1 with a drain electrode connected to a sensing node $\overline{LA}$, a source electrode connected to the bit line BL and a gate electrode connected to the bit line $\overline{BL}$, and a second NMOS transistor T2 with a drain electrode connected to the sensing node $\overline{LA}$, a source electrode connected to the bit line $\overline{BL}$ and a gate electrode connected to the bit line BL.

A third PMOS transistor 25 for supplying a power voltage VCC is connected to the sensing node LA. A third NMOS transistor 30 for supplying a ground voltage VSS is connected to the sensing node $\overline{LA}$. First and second control signals LAPG and LANG are connected to gate electrodes of the third PMOS transistor 25 and the third NMOS transistor 30. If the third PMOS transistor 25 and the third NMOS transistor 30 are turned on, the power voltage VCC and the ground voltage VSS are supplied to the sensing nodes LA and $\overline{LA}$ respectively, thereby operating the PMOS sense amp 40 and the NMOS sense amp 35.

FIG. 2A shows a peak value of leakage current Iss versus the power voltage when a sensing window (an interval between starting the sensing operation of the PMOS sense amp 40 after starting the sensing operation of the NMOS sense amp 35) is 3 nanoseconds (ns) and 0ns. FIG. 2B shows sensing delay time versus the power voltage for the sensing windows of 3 ns and 0 ns.

In operation, after the data of the memory cell is conveyed to the bit lines BL and $\overline{BL}$, the NMOS sense amp 35 carries out the sensing operation and the PMOS sense amp 40 performs a restore operation. However, if the bit lines BL and $\overline{BL}$ are precharged to half the power voltage VCC, that is, to (½)VCC, since a difference between gate-source voltages Vgs of the transistors T1 and T2 constituting the NMOS sense amp 35 becomes only a charge sharing voltage ΔV, current flows into both transistors T1 and T2 the moment the sensing operation is started. Similarly, since the difference between the gate-source voltages Vgs of the transistors T3 and T4 constituting the PMOS sense amp 40 becomes only the charge sharing voltage ΔV, current flows into both transistors T3 and T4.

When the NMOS sense amp 35 and the PMOS sense amp 40 simultaneously operate, the operation has nothing to do with the bit line sensing operation and a current path is formed. Thus the leakage current Iss increases. As is well known, since this bit line sensing operation is performed almost on the same time on all the bit lines, the peak value of the leakage current Iss greatly increases, ground voltage noise occurs and operating dissipation current increases.

To overcome these shortcomings, a PMOS sense amp enable signal PSE and an NMOS sense amp enable signal NSE are applied to a PMOS sense amp delay circuit 5 and an NMOS sense amp delay circuit 15 respectively, to generate respective first and second delay signals PISD and PSD. The delay signals PISD and PSD are supplied to first and second control signal generating circuits 10 and 20, to generate the first and second control signals LAPG and LANG for controlling the NMOS and PMOS sense amps 35 and 40, respectively. The bit line sensing circuit shown in FIG. 1 generates the second control signal LANG, and after a prescribed time generates the first control signal LAPG.

In the bit line sensing circuit shown in FIG. 1, the first and second delay signals PISD and PSD respectively supplied to the first and second control signal generating circuits 10 and 20 which respectively generate the first and second control signals LAPG and LANG for generating the PMOS and NMOS sense amps 40 and 35, are generated through respective delay paths. Therefore, the time to operate the NMOS and PMOS sense amps 35 and 40 can be controlled by controlling a delay time difference.

When the sensing window is 3 ns and 0 ns, that is, when the operating time of the NMOS sense amp 35 is before that of the PMOS sense amp 40, and when the former is the same as the latter, respectively, the peak value of the leakage current and the sensing delay time versus the power voltage VCC of 1.6–3.3 V are shown in FIGS. 2A and 2B. The obtained charts are from a 256K block model using cell capacitance of 30 pF and bit line capacitance of 240 pF. The sensing delay time is defined from the operating time of the NMOS sense amp 35 to the time a voltage difference between the bit lines BL and $\overline{BL}$ is VCC×0.3, and the peak value of the leakage current is obtained by measuring the maximum leakage current. As indicated, the sensing delay time increases and the peak value of the leakage current decreases with a decrease in the power voltage. At the same power voltage, the sensing window of 0 ns has large leakage current and short sensing delay time relative to the sensing window of 3 ns.

Therefore, the sensing current is generated irrespective of the bit line sensing operation, and is cut off by providing the sensing window, i.e., an interval between the operating times of the NMOS and PMOS sense amps. However, since the operating time of the PMOS sense amp is delayed by the sensing window interval, the entire sensing operating time increases.

On the other hand, in a semiconductor memory device used for battery back-up, since the power voltage is lowered according to the discharge of the battery, the operating speed is rapidly lowered and the leakage current is also sharply reduced. Therefore, in a memory device which is operated by a battery, for example, it is necessary to improve the operating speed even when the leakage current, which does not give rise to trouble at a low power voltage, increases.

SUMMARY OF THE INVENTION

It is therefore an object of the invention to provide a bit line sensing circuit and method which provides a sensing window between NMOS and PMOS sense amps at a high power voltage, and removes the sensing window at a low power voltage.

It is another object of the invention to provide a bit line sensing circuit and method for reducing leakage current and operating current at a high power voltage, and achieving a high speed operation at a low power voltage.

It is a further object of the invention to provide a bit line sensing circuit and method having a plurality of sensing windows set in response to a power voltage level.

It is a still further object of the invention to provide a bit line sensing circuit and method for variably controlling an interval between the operating times of the NMOS and PMOS sense amps in response to a power voltage level.

In accordance with one aspect of the present invention, a bit line sensing circuit of a semiconductor memory device having NMOS and PMOS sense amps connected to a bit line includes a variable delay path for variably controlling an interval of the operating time between the NMOS and PMOS sense amps in response to a power voltage sensing signal generated by sensing a power voltage level.

DETAILED DESCRIPTION OF THE PREFERRED EMBODIMENT

Figure 1:
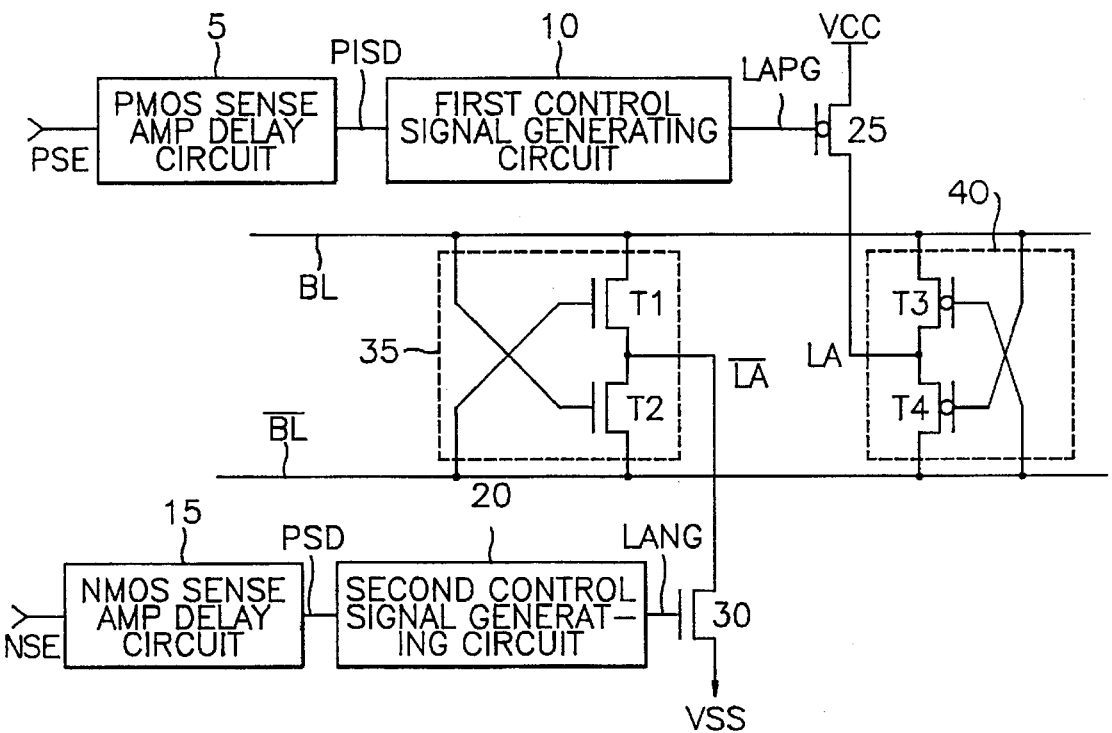
FIG. 1 is a schematic diagram of a conventional bit line sensing circuit.
Figure 3:
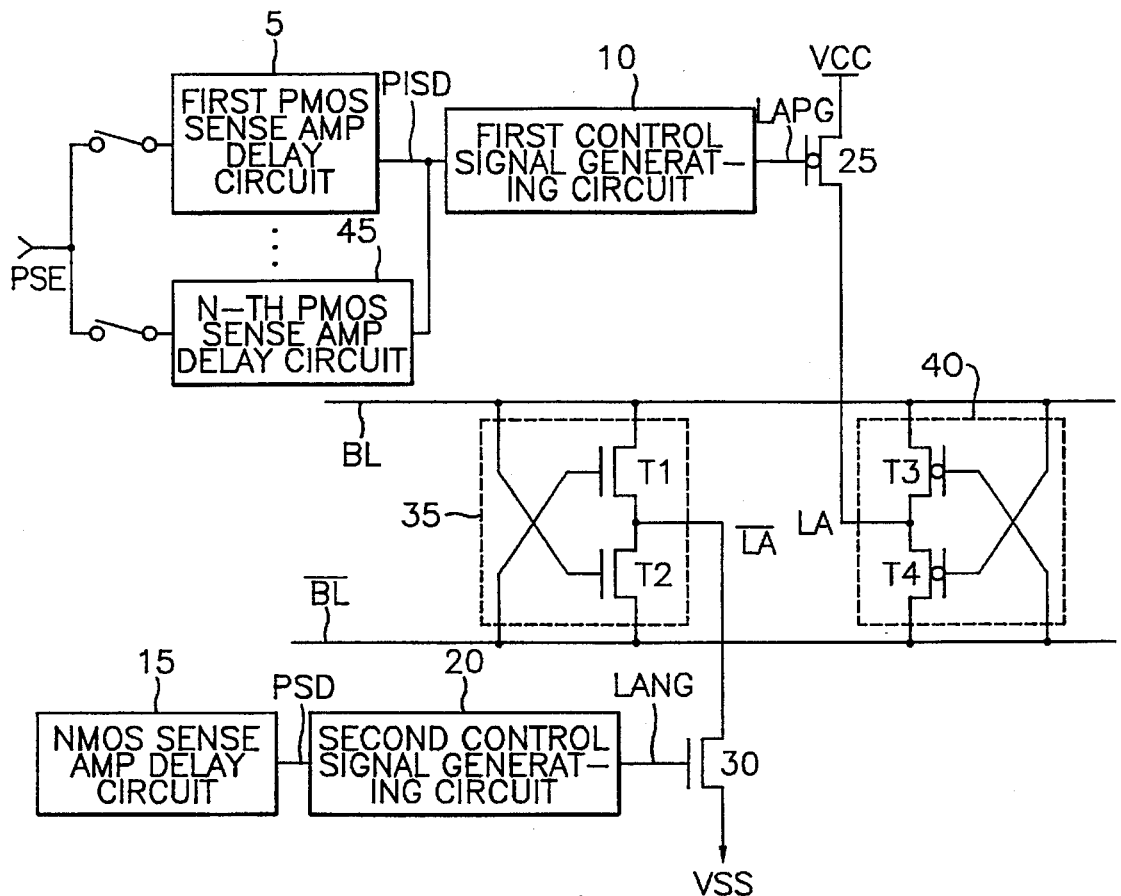
FIG. 3 is a schematic diagram of a bit line sensing circuit according to one embodiment of the present invention.
Figure 2A:
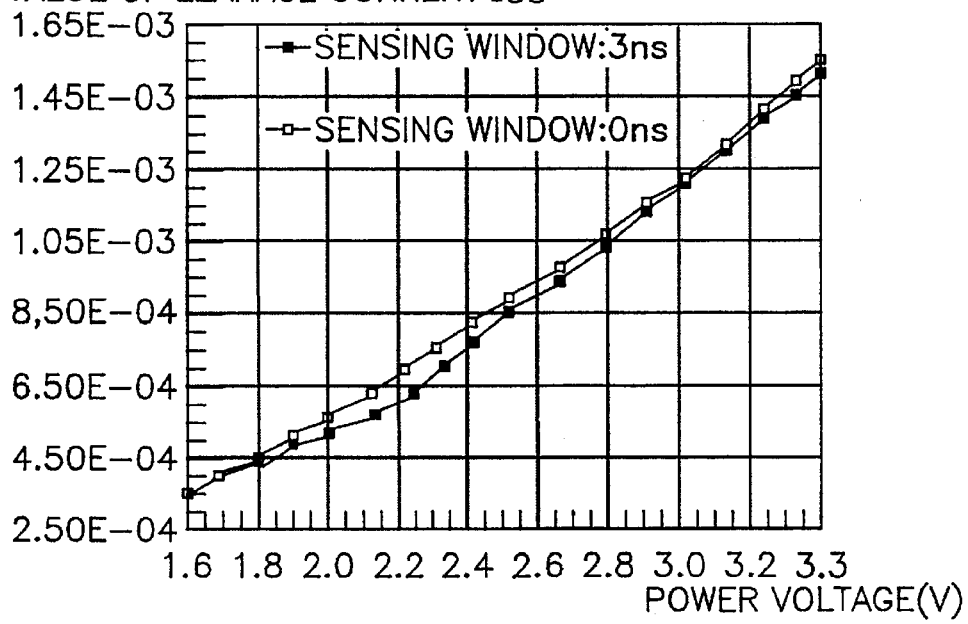
FIG. 2A is a chart illustrating a peak value of leakage current versus a power voltage.
Figure 2B:
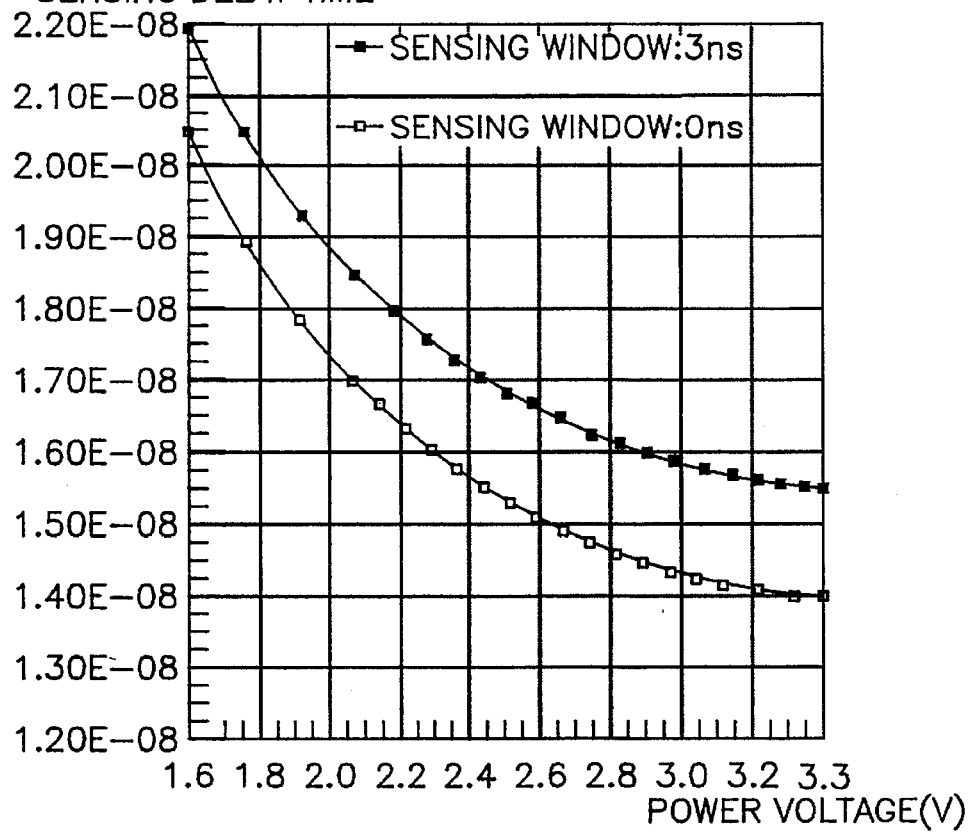
FIG. 2B is a chart illustrating sensing delay time versus a power voltage.

As shown in FIG. 3, a PMOS sense amp 40, an NMOS sense amp 35, first and second control signal generating circuits 10 and 20 have the same construction as those of the conventional bit line sensing circuit of FIG. 1. There are provided first to n-th PMOS sense amp delay circuits 5 to 45 for receiving the PMOS sense amp enable signal PSE and generating the first delay signal PISD. A first NMOS sense amp delay circuit 15 receives the NMOS sense amp enable signal NSE and generates the second delay signal PSD. The first NMOS sense amp delay circuit 15 has the same construction as the delay circuit 15 of FIG. 1.

In FIG. 1, the delay signals PISD and PSD are generated along a constant delay path. In FIG. 3, however, the delay path for generating the delay signal PISD differs to control the operating time of the NMOS and PMOS sense amps 35 and 40 differently or identically.

Figure 4:
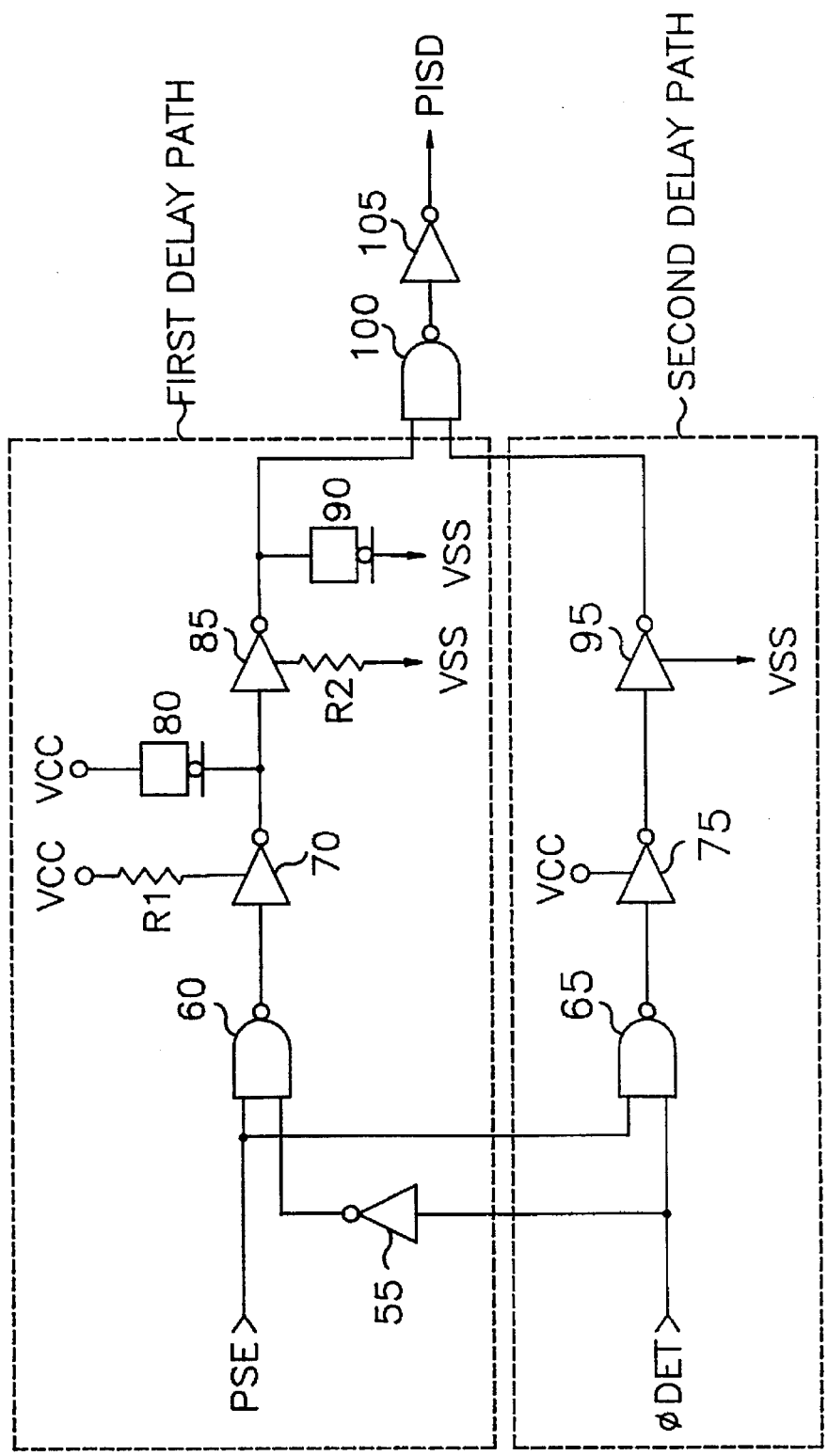
FIG. 4 is a more detailed circuit diagram of a delay circuit of FIG. 3.

As shown in FIG. 4, the delay circuit includes first and second delay paths. The first delay path has a first inverter 55 for receiving a power voltage sensing signal $\phi$DET generated from a power voltage sensing circuit, a first NAND gate 60 for receiving the output signal of the first inverter 55 and the PMOS sense amp enable signal PSE, a second inverter 70 for inverting the output signal of the first NAND gate 60, a first capacitor 80 connected between the power voltage VCC and the output signal of the second inverter 70, a third inverter 85 for receiving the output signal of the second inverter 70, and a second capacitor 90 connected between the output signal of the third inverter 85 and a ground voltage VSS. A first resistor R1 is connected between the power voltage VCC and the first inverter 70, and a second resistor R2 is connected between the ground voltage VSS and the second inverter 85.

The second delay path includes a second NAND gate 65 for receiving the power voltage sensing signal $\phi$DET and the PMOS sense amp enable signal PSE, a fourth inverter 75 for receiving the output signal of the second NAND gate 65, and a fifth inverter 95 for receiving the output signal of the fourth inverter 75. The output signals generated from the first and second delay paths are supplied to a third NAND gate 100 and further to a sixth inverter 105 to generate the delay signal PISD. These first and second delay paths correspond to the first and n-th delay circuits 5 and 45 shown in FIG. 3. That is, in order to generate the delay signal PISD, the bit line sensing circuit shown in FIG. 1 has only one delay path, however, the circuit shown in FIG. 3 has a plurality of delay paths. The first NMOS sense amp delay circuit 15 for driving the NMOS sense amp 35 may be easily constructed by the prior art. The power voltage sensing circuit for generating the power voltage sensing signal $\phi$DET may be easily constructed by a general power voltage sensing circuit used in this art.

In operation, the bit line sensing circuit according to the present invention receives the power voltage sensing signal $\phi$DET generated in response to a power voltage level and determines the delay path by the power voltage level. If the power voltage is low, it is possible to have a small sensing window or none at all, and if the power voltage is high, the sensing window is provided, thereby improving the operating characteristic of the low power voltage.

If a power voltage lower than 2.3 V is supplied, the power voltage sensing signal $\phi$DET is maintained at logic "high", and the delay signal PISD of logic "low" is generated through the second delay path where there is scarcely any delay. Therefore, there is no delay time difference in the enable time between the PMOS and NMOS sense amps 40 and 35. If a power voltage higher than 2.3 V is supplied, the power voltage sensing signal $\phi$DET is maintained at logic "low", and the delay signal PISD of logic "low" is generated through the first delay path having the delay time of about 3 ns, thereby controlling the sensing window between the PMOS and NMOS sense amps 40 and 35. If necessary, the delay time of the first delay path can be easily controlled by adjusting the resistance values of the resistors R1 and R2 and the capacitance values of the capacitors 80 and 90.

Figure 5A:
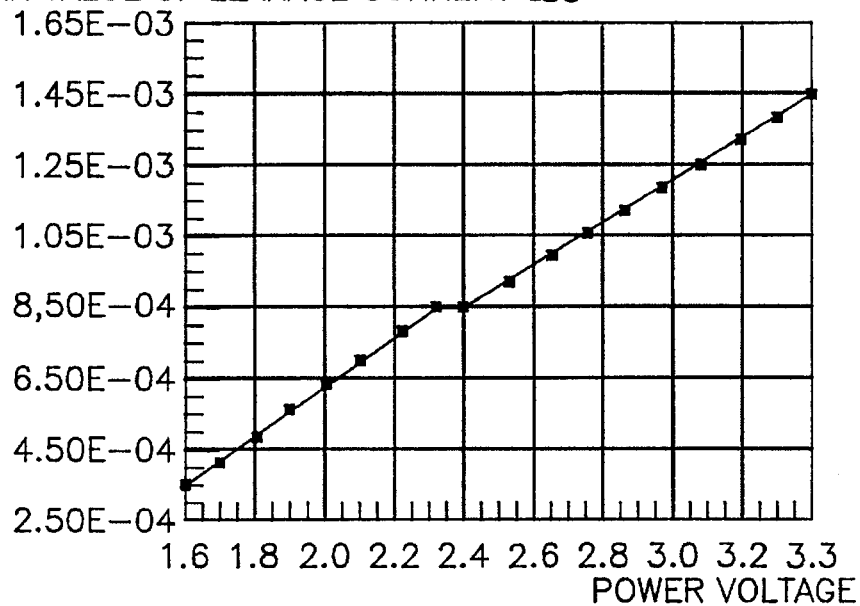
FIG. 5A is a chart illustrating a peak value of leakage current of FIG. 3 versus a power voltage.
Figure 5B:
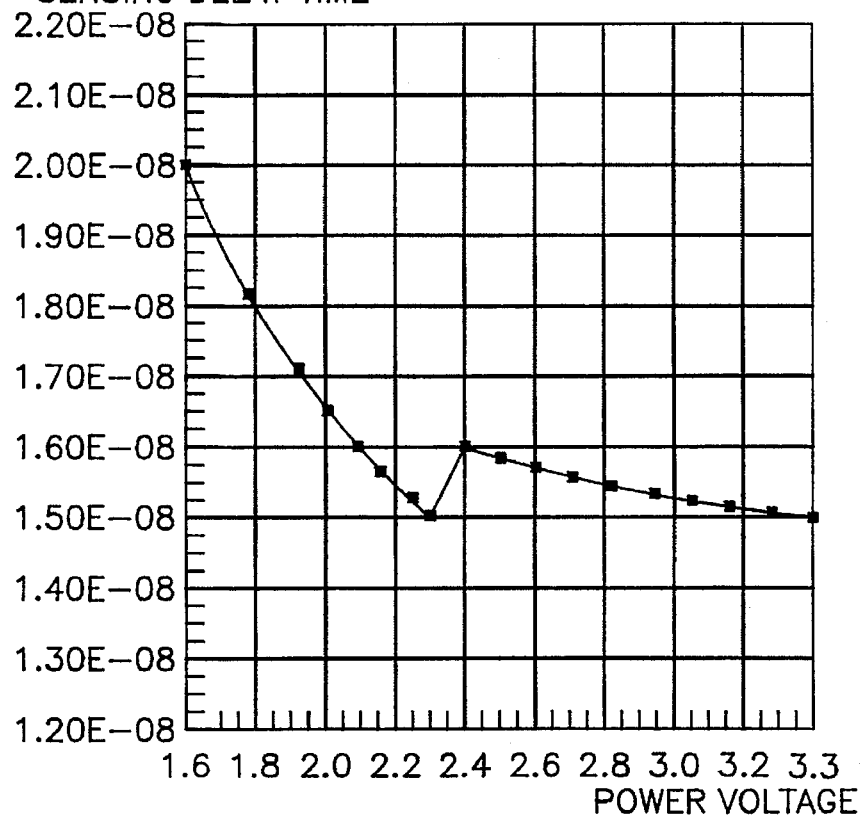
FIG. 5B is a chart illustrating sensing delay time of FIG. 3 versus a power voltage.

FIGS. 5A and 5B show improved operating characteristics at the low power voltage by setting the sensing window to 0 ns at the power voltage lower than 2.3 V and to 3 ns at the power voltage higher than 2.3 V.

In FIG. 3, the first and n-th PMOS sense amp delay circuits having respective delay paths are connected to drive the PMOS sense amp 40. Meanwhile, other variable delay paths may be connected to generate the delay signal PSD. Thus the sensing window may be set to 0 ns for the power voltage lower than 2.3 V and to 3 ns for the power voltage higher than 2.3 V.

Figure 6:
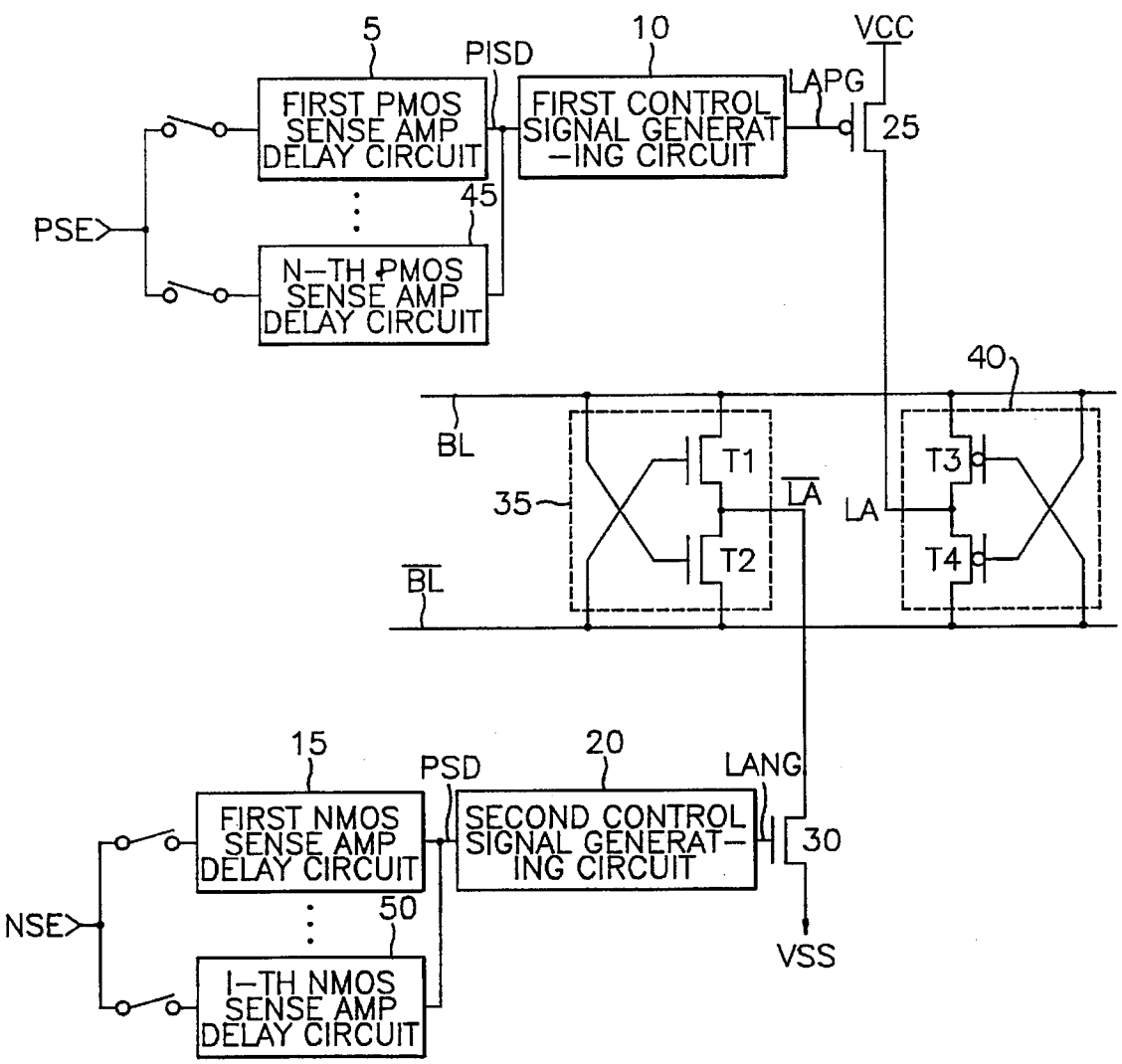
FIG. 6 is a schematic diagram of another bit line sensing circuit according to another embodiment of the present invention.

FIG. 6 illustrates another bit line sensing circuit. The variable delay paths for generating the delay signal PSD are further provided compared with the circuit of FIG. 3. The first to n-th PMOS sense amp delay circuits 5–45 and first to i-th NMOS sense amp delay circuit 15–50 have the respective delay paths. These delay paths may be constructed by the circuit of FIG. 4. In this instance, in order to set the delay time of the first delay path used in the PMOS sense amp slower than the delay time of a first delay path used in the NMOS sense amp, the former is delayed by about 3 ns by adjusting the resistance values of the resistors R1 and R2 and the capacitance values of the capacitors 80 and 90.

If a power voltage higher than 2.3 V is supplied, the n-th PMOS sense amp delay path and the i-th NMOS sense amp delay path are selected to have the sensing window of 0 ns. If a power voltage lower than 2.3 V is supplied, the first PMOS sense amp delay path and the first NMOS sense amp delay path are selected to have the sensing window of 3 ns.

As described above, in a battery back-up memory device whose power voltage decreases according to the discharge of the battery, for example the leakage current is suppressed at a high power voltage by providing the time interval of the operating time between the NMOS and PMOS sense amps. At a low power voltage, the operating speed is improved by removing the time interval of the operating time between the NMOS and PMOS sense amps.

What is claimed is:

1. A bit line sensing circuit of a semiconductor memory device having NMOS and PMOS sense amps connected between a bit line pair, comprising:

a variable delay circuit which variably controls an interval between sensing operations of said NMOS and PMOS sense amps in response to a power voltage sensing signal indicating a power voltage level.

2. The bit line sensing circuit according to claim 1, wherein said variable delay circuit is correspondingly connected to said PMOS sense amp so that a first interval between sensing operations of said PMOS sense amp and said NMOS sense amp is provided when said power voltage level is higher than a prescribed level, and a second interval between sensing operations of said PMOS sense amp and said NMOS sense amp is provided when said power voltage level is lower than said prescribed level.

3. The bit line sensing circuit according to claim 1, wherein said variable delay circuit is correspondingly connected to said NMOS sense amp so that a first interval between sensing operations of said PMOS sense amp and said NMOS sense amp is provided when said power voltage level is lower than a prescribed level, and a second interval between sensing operations of said PMOS sense amp and said NMOS sense amp is provided when said power voltage level is higher than said prescribed level.

4. The bit line sensing circuit according to claim 1, wherein said variable delay circuit is correspondingly connected to said PMOS and NMOS sense amps so that a first interval is provided between sensing operations of said PMOS sense amp and said NMOS sense amp is provided when said power voltage level is higher than a prescribed level, and a second interval is provided between sensing operations of said PMOS sense amp and said NMOS sense amp is provided when said power voltage level is lower than said prescribed level.

5. A bit line sensing method of a semiconductor memory device having NMOS and PMOS sense amps connected between a bit line pair, comprising the step of:

controlling an interval between sensing operations of said NMOS and PMOS sense amps in response to a power voltage sensing signal indicating a power voltage level.

6. The bit line sensing method according to claim 5, wherein said step of controlling said interval includes controlling an operating time of said PMOS sense amp so that a first interval between sensing operations of said PMOS sense amp and said NMOS sense amp is provided when said power voltage level is higher than a prescribed level, and a second interval between sensing operations of said PMOS sense amp and said NMOS sense amp is provided when said power voltage level is lower than said prescribed level.

7. The bit line sensing method according to claim 5, wherein said step of controlling said interval includes controlling an operating time of said NMOS sense amp so that a first interval between sensing operations of said PMOS sense amp and said NMOS sense amp is provided when said power voltage level is higher than a prescribed level, and a second interval between sensing operations of said PMOS sense amp and said NMOS sense amp is provided when said power voltage level is lower than said prescribed level.

8. The bit line sensing method according to claim 5, wherein said step of controlling said interval includes controlling an operating time of said PMOS and NMOS sense amps so that a first interval between sensing operation of said PMOS sense amp and said NMOS sense amp is provided when said power voltage level is higher than a prescribed level, and a second interval between sensing operations of said PMOS sense amp and said NMOS sense amp is provided when said power voltage level is lower than said prescribed level.

9. A bit line sensing circuit according to claim 2, wherein said first interval is longer than said second interval.

10. A bit line sensing circuit according to claim 3, wherein said first interval is shorter than said second interval.

11. A bit line sensing circuit according to claim 4, wherein said first interval is longer than said second interval.

12. A bit line sensing method according to claim 6, wherein said first interval is longer than said second interval.

13. A bit line sensing method according to claim 7, wherein said first interval is longer than said second interval.

14. A bit line sensing method according to claim 8, wherein said first interval is longer than said second interval.

15. A semiconductor memory device comprising:

a bit line pair;

an NMOS sense amp connected between said bit line pair;

a PMOS sense amp connected between said bit line pair, an interval being defined by a delay between a sensing operation of said NMOS sense amp on said bit line pair and a sensing operation of said PMOS sense amp on said bit line pair; and a bit line sensing circuit which controls said NMOS and PMOS sense amps, said bit line sensing circuit having a first delay path which sets a first interval and a second delay path which sets a second interval different from said first interval.

16. The semiconductor memory device according to claim 15, wherein said bit line sensing circuit controls said NMOS and PMOS sense amps according to said first delay path during a first operating voltage and according to said second delay path during a second operating voltage.

17. The semiconductor memory device according to claim 16, wherein said first interval is shorter than said second interval and wherein said first operating voltage is less than said second operating voltage.

18. The semiconductor memory device according to claim 17, wherein said first interval is substantially zero.

* * * * *